United States Patent
Chou (10) Patent No.: US 7,312,740 B2
(45) Date of Patent: Dec. 25, 2007

(54) CURRENT STEERING DIGITAL-TO-ANALOG CONVERTER

(75) Inventor: Kuo-Yu Chou, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/306,256

(22) Filed: Dec. 21, 2005

(65) Prior Publication Data

US 2007/0090981 A1  Apr. 26, 2007

(30) Foreign Application Priority Data

Oct. 25, 2005  (TW) .............................. 94137240 A (51) Int. Cl.
  *H03M 1/66* (2006.01)
(52) U.S. Cl. ...................... 341/145; 341/144
(58) Field of Classification Search ................ 341/145, 341/118, 135, 133, 144
  See application file for complete search history.

(56) References Cited

U.S. PATENT DOCUMENTS 6,288,660 B1 * 9/2001 Nisbet ........................ 341/144
6,507,304 B1 * 1/2003 Lorenz ........................ 341/144
6,583,744 B2 * 6/2003 Bright ......................... 341/145
6,967,609 B1 * 11/2005 Bicakci et al. .............. 341/144
2001/0026236 A1 * 10/2001 Toda ........................... 341/145
2004/0183706 A1 * 9/2004 Brauns et al. .............. 341/144

* cited by examiner

*Primary Examiner*—Rexford Barnie
*Assistant Examiner*—Joseph Lauture
(74) *Attorney, Agent, or Firm*—Jianq Chyun IP Office (57) ABSTRACT

A current steering digital-to-analog converter (DAC) is provided. At least two lower-resolution DACs are used for converting a high-resolution digital signal. One of the two lower-resolution DACs is used for converting the most significant bits (MSB) of the high-resolution digital signal. The other of the two lower-resolution DACs is used for converting the least significant bits (LSB) of the high-resolution digital signal. By such arrangement, a device mismatch problem is avoided and the chance of variation occurrence during manufacturing process is reduced. The arrangement also simplifies the layout in the significantly scaled-down chip area.

17 Claims, 6 Drawing Sheets

CURRENT STEERING DIGITAL-TO-ANALOG CONVERTER

CROSS-REFERENCE TO RELATED APPLICATION

This application claims the priority benefit of Taiwan application serial no. 94137240, filed on Oct. 25, 2005. All disclosure of the Taiwan application is incorporated herein by reference.

BACKGROUND OF THE INVENTION

1. Field of Invention

The present invention relates to a digital-to-analog converter (DAC). More particularly, the present invention relates to a current steering digital-to-analog converter, which can improve resolution and resolve device mismatch by using two lower-resolution digital-to-analog converters.

2. Description of Related Art

The digital-to-analog converter (referred to as DAC hereinafter) has been widely used for data conversion in electronic apparatuses. A DAC is mainly used for converting a digital signal into a corresponding analog signal, so that the analog signal can be applied to an electronic apparatus. The field whereto DAC is applied is very extensive. For example, high-resolution and high-speed DAC can be used in the communication system such as cell phone or base station, wireless communication network, image processing and display system, or audiovisual system etc.

Figure 1A:
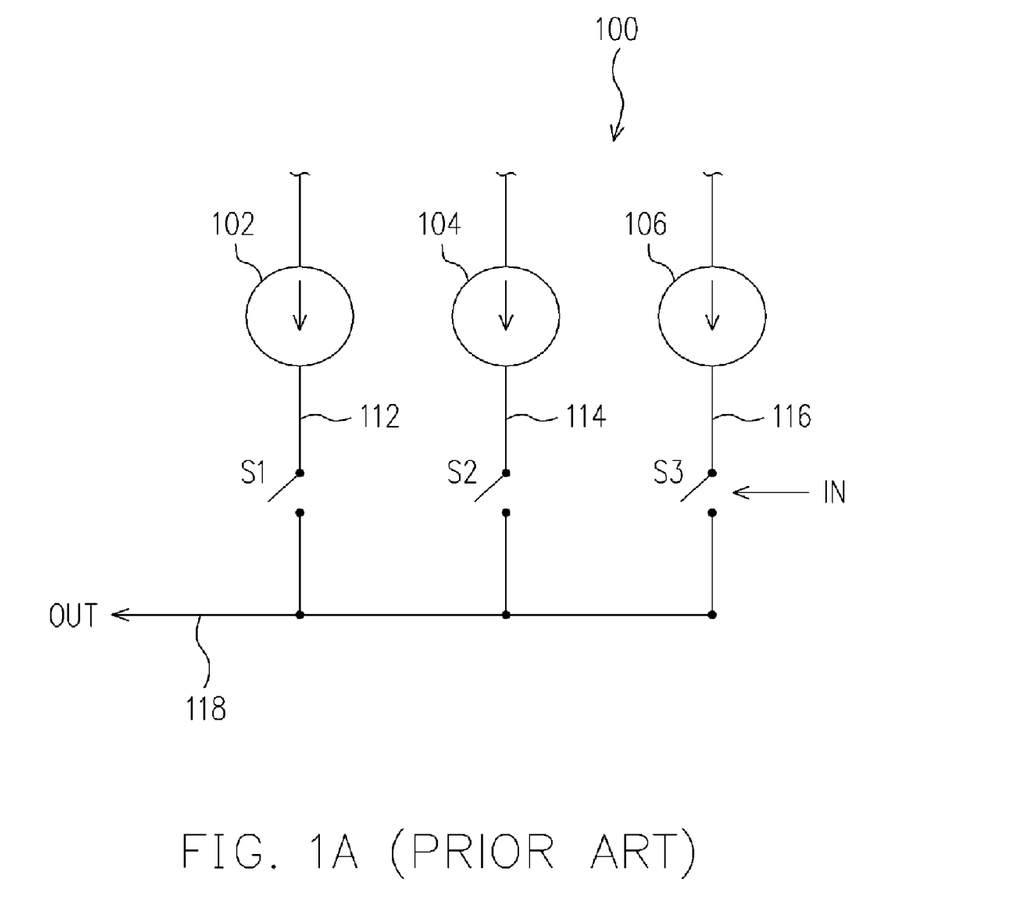
FIG. 1A is a circuit diagram of a conventional binary-weighted DAC.

Generally, a typical DAC is, for example, a binary-weighted DAC. A binary-weighted DAC includes various current sources and corresponding switches. FIG. 1A is a circuit diagram of a conventional binary-weighted DAC. Here a 3-bit DAC including 3 current sources 102, 104, and 106, and 3 corresponding switches S1, S2, and S3 are given as example. The current source 102 is connected to the switch S1 through wiring 112 and outputs through output wiring 118. The current source 104 is connected to the switch S2 through wiring 114 and outputs through output wiring 118. The current source 106 is connected to the switch S3 through wiring 116 and outputs through output wiring 118. The ratio of the current provided by the 3 current sources 102, 104, and 106 is 4:2:1; that is, if the current provided by the current source 106 is 1A, then the current provided by the current sources 104 and 102 are respectively 2A and 4A.

During the operation, the input code IN controls the on/off of the switches S1, S2, and S3, and the corresponding output current is output to the output terminal OUT through wiring 118. With this control, the quantity of the output current is proportional to the input code IN, and a typical output stage circuit (not shown), such as an operation amplifier, can be connected to the DAC in series to convert the output current into a corresponding voltage value, or into a low-impedance voltage output. The control circuit of this kind of binary-weighted DAC is simple.

Figure 1B:
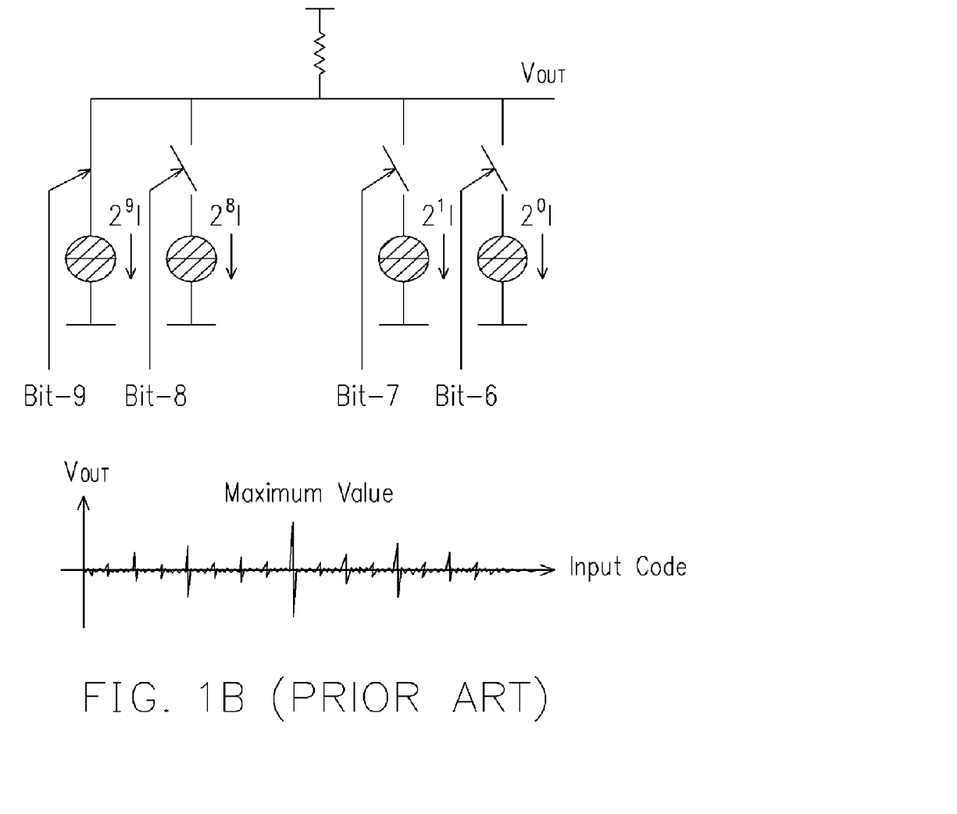
FIG. 1B is a diagram illustrating the corresponding coordinates of the input code and the Differential Non-Linearity (DNL) Error.
Figure 1C:
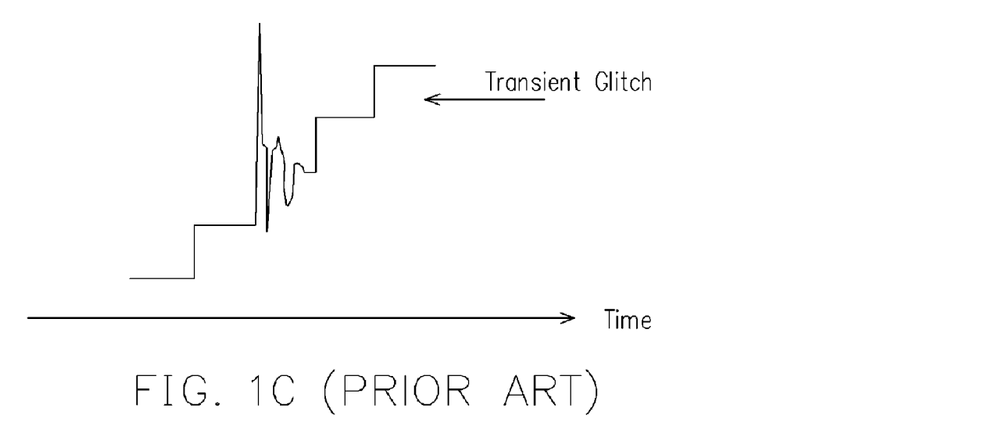
FIG. 1C illustrates a case during the process of data conversion, unpredictable transient glitch occurs.

However, some transient glitch may still occur, which may affect the accuracy of the digital-to-analog conversion, during the operation described above. For example, when the input code IN is converted from 011 (binary) to 100, all the 3 switches S1, S2, and S3 will change their status even though the value changed is only "1". This characteristic of the binary-weighted DAC makes it inapplicable to high-resolution conversion, and it's not guaranteed to be a non-monotonic function. Referring to FIG. 1B, which is a diagram illustrating the corresponding coordinates of the input code and the differential non-linearity (DNL) error. According to the input code, large DNL error may be occur at certain intervals. That's because at two adjacent points of the conversion function of converting the digital input code IN to an analog signal, the output analog value may deviate from the ideal value. The problem of DNL error will affect the accuracy of the DAC output, or even worse, will result in very serious non-monotonic problem. The non-monotonic problem is that the output analog value corresponding to a smaller digital input code IN is greater than the output analog value corresponding to a greater digital input code IN, which may cause very serious error. It can be understood from FIG. 1C that during the data conversion process, unpredictable transient glitch may occur.

In other words, if a higher-resolution binary-weighted DAC is used, each digital bit received controls $2^{(n-1)}$ current source cells. For example, for a 10-bit binary-weighted DAC, n is 1 to 10, thus, the transient glitch is very serious. The DNL error problem may be caused by different characteristics of the transistors formed in the arrangement of current source cells. The differences between the formed transistors are generally differences caused during the semiconductor fabricating process, such as difference in oxide layers, very bad polysilicon etching, or ion implant offset etc. Moreover, this kind of binary-weighted DAC takes a lot of chip layout space.

Figure 2:
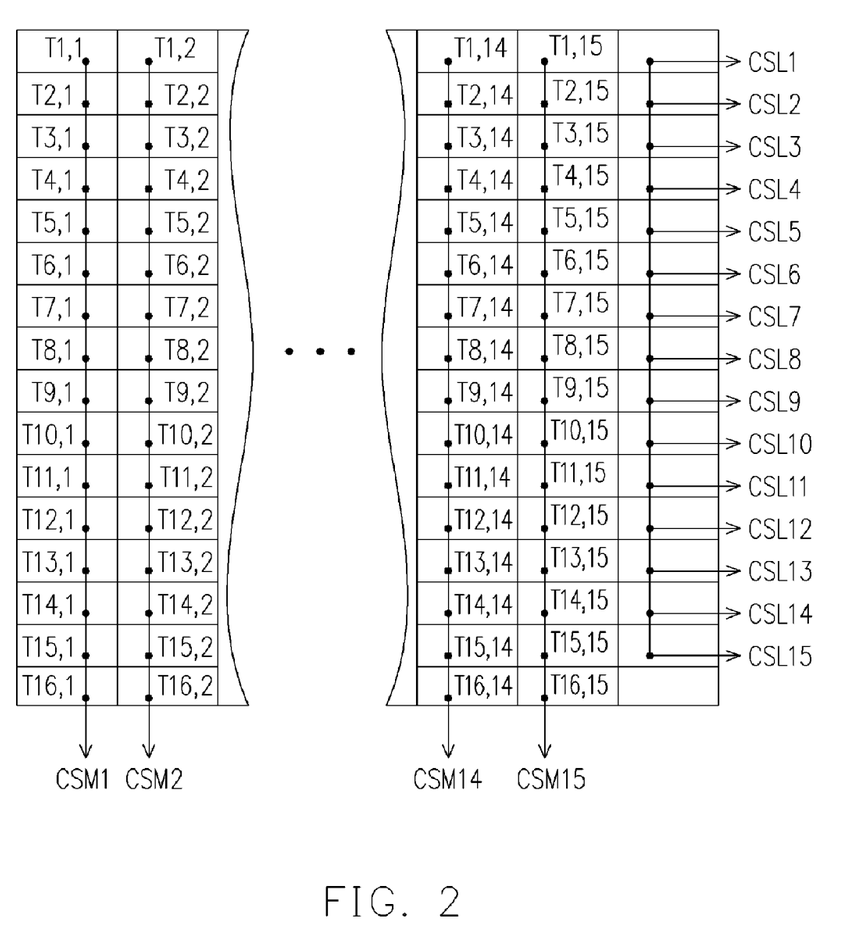
FIG. 2 is a diagram illustrating the arrangement of current source cells of LSB and MSB.

To solve the transient glitch, a thermometer code DAC is provided by those skilled in the art to control the output of the current source. Referring to FIG. 2, which is a diagram illustrating the layout of an 8-bit thermometer code DAC. The 8-bit thermometer code DAC converts the first 4 most significant bits (referred to as MSB thereinafter) into corresponding 15-bit data M1, M2, M3 . . . M15 (M1~M15). In addition, the 8-bit thermometer code DAC converts the first 4 least significant bits (referred to as LSB thereinafter) into corresponding 15-bit data L1, L2, L3 . . . L15 (L1~L15). The converted data is the "thermometer code" output. The thermometer code can be used for preventing transient glitch produced when the code IN is increased progressively.

The thermometer code DAC further includes 15 current source cells CSM1~CSM15 corresponding to the MSB and 15 current source cells CSL1~CSL15 corresponding to the LSB. The arrangements of the LSB current source cells CSL1~CSL15 and the MSB current source cells CSM1~CSM15 are as shown in FIG. 2. The LSB and MSB current source cells are formed by 255, including 16 columns and 16 rows, MOS transistors. Each transistor is denoted as Tij, wherein i and j represent the number of column and the number of row respectively.

In the DAC which controls current source output using thermometer code, the numbers of current source cells controlled by each thermometer code are only different by 1, thus the transient glitch can be avoided effectively. However, the current source cells required are large and the control circuit is very complicated.

To reduce the size of the required current source cells and minimize the complexity of the control circuit, a segment type DAC, which combines the thermometer code DAC and the binary-weighted DAC, is provided by those skilled in the art to control the output of the current source. Assuming a segment type DAC with N-bit digital-to-analog conversion function is used, then the first M MSB of the N-bit input code is converted with thermometer code digital-to-analog conversion. And the other N-M LSB is converted with binary-weighted digital-to-analog conversion.

Figure 3:
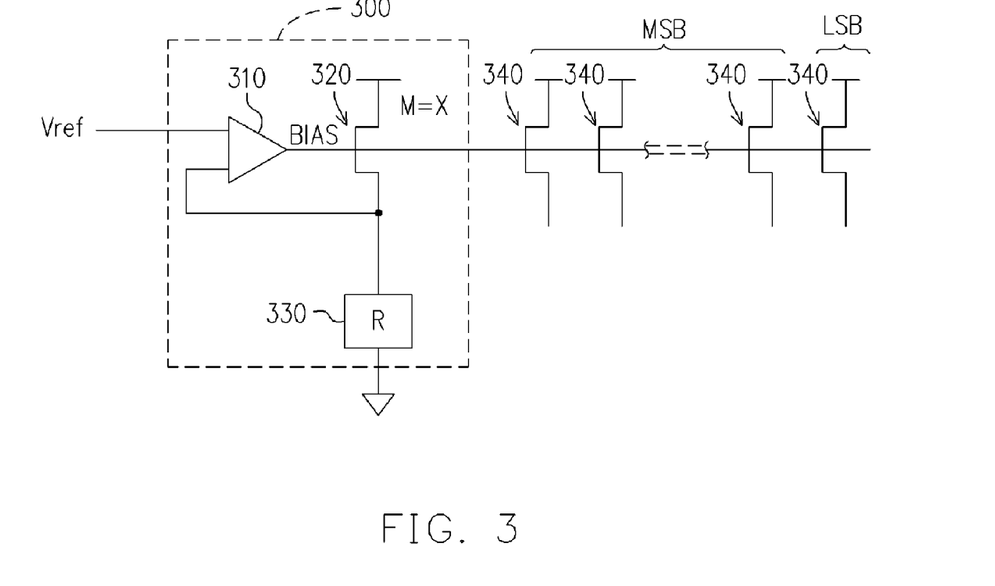
FIG. 3 is a circuit diagram illustrating the bias producing method of the current source cell of a DAC.

Please refer to FIG. 3, which is a circuit diagram illustrating the bias generation method of a conventional current steering DAC. The bias thereof is generated by a bias generation circuit 300, which includes an operation amplifier 310, a transistor 320, and a resistor 330. The current generated is Vref/R, the unit current thereof is Vref/(R*X), wherein R is the resistance of the resistor 330, and X is the magnification power of the transistor 320. As long as the sizes of all the transistors 340, for example, P-type metal oxide semiconductors (referred to as PMOS thereinafter), in the current source cells of the thermometer code portion of the MSB and the current source cells of the binary-weighted portion of the LSB are the same, the purpose of weighting, and further the purpose of controlling the output current, can be achieved by controlling only the number of PMOS.

For example, if a 10-bit DAC is a binary-weighted DAC, then the binary weights are 512, 256, 128, 64, 32, 16, 8, 4, 2, and 1, and 1023 PMOS transistors are required. If it is a DAC combining the thermometer code DAC and the binary-weight DAC, then the thermometer code portion is 64*15, and the binary-weight portion is 32, 16, 8, 4, 2, and 1; that is, (64*15, 32, 16, 8, 4, 2, 1), which is 1023, PMOS transistors are required.

The structure of this kind of current steering DAC, regardless of binary-weight type or the combination of thermometer code type and binary-weight type, requires 1023 current source cells. Thus a lot of chip area is consumed and the circuit layout becomes too complicated. In addition, the difference in circuit layout may result in mismatch between current source cells. And the mismatch between current source cells may worsen the linearity characteristic of the DAC, or even cause the aforementioned problem of non-monotonic function. The main reason for the mismatch between current source cells is device mismatch, which is due to device variation during the manufacturing process, and the problem can be improved by using appropriate layout, but can not be eliminated. For example, if the distances between current source cells and the output terminal are different and the differences are compensated with metal wire, then the surface area of the entire current cell array is enlarged, which is against the present trend of reducing chip area.

The chip area will become smaller and smaller in consideration of manufacturing cost and future application. And this is also another reason for the mismatch problem. Since the sizes of devices are getting smaller, to reduce the chip area, the layout limitation is getting stricter, so that the connecting wires of the devices in the chip are strictly restricted.

As a result, the higher the requirement of the DAC to the resolution, the more serious the device mismatch problem.

SUMMARY OF THE INVENTION

Accordingly, the present invention is directed to provide a current steering digital-to-analog converter (DAC), which uses at least two lower-resolution DACs for converting a high-resolution digital signal, wherein one of the two lower-resolution DACs is used for converting the most significant bits (MSB) of the high-resolution digital signal, and the other of the two lower-resolution DACs is used for converting the least significant bits (LSB) of the high-resolution digital signal. By such arrangement, a device mismatch problem is avoided and the chance of variation during manufacture is reduced. The arrangement also simplifies the layout in the significantly scaled-down chip area. The difference in the current provided by the two lower-resolution DACs is determined according to the number of bits to be converted.

According to an embodiment of the present invention, a current steering DAC is provided for converting a digital signal of a first bit number. The current steering DAC includes a first DAC, a second DAC, and a current mirror. The first DAC is used for converting a digital signal of a second bit number and outputting a first output current. The second DAC is used for converting a digital signal of a third bit number and outputting a second output current, wherein the total bit number of the second bit number and the third bit number is equal to the first bit number. The current mirror is used for mapping and outputting the first output current of the first DAC as a mapped output current, wherein the output of the current steering DAC is the total current of the mapped output current of the current mirror and the second output current of the second DAC.

According to an embodiment of the present invention, in the aforementioned current steering DAC, the mapped output current is a magnified output current by multiplying the first output current of the first DAC by $2^N$, wherein N is integer, and the third bit number.

According to an embodiment of the present invention, in the aforementioned current steering DAC, the second bit number is the MSB of the first bit number, and the third bit number is the LSB of the first bit number.

According to an embodiment of the present invention, the aforementioned current steering DAC further includes a bias generation unit for providing a constant bias to the first DAC and the second DAC so that the digital-to-analog conversion can be performed accordingly.

According to an embodiment of the present invention, the aforementioned current steering DAC further includes a first bias generation unit and a second bias generation unit, wherein the first bias generation unit is used for providing a first constant bias to the first DAC, and the second bias generation unit is used for providing a second constant bias to the second DAC, so that the digital-to-analog conversion can be performed accordingly.

According to an embodiment of the present invention, in the aforementioned current steering DAC, the first DAC includes a plurality of control units, and the first DAC selectively turns on the control units according to the received digital signal of the second bit number and converts a first input current into the first output current of the first DAC accordingly.

According to an embodiment of the present invention, in the aforementioned current steering DAC, the second DAC includes a plurality of control units, and the second DAC selectively turns on the control units according to the received digital signal of the third bit number and converts a second input current into the second output current of the second DAC accordingly.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention provides a current steering DAC, which uses at least two lower-resolution DACs for converting a high-resolution digital signal. In the current steering DAC, one of the two lower-resolution DACs is used for converting the most significant bits (referred to as MSB hereinafter) of the high-resolution digital signal, and the other of the two lower-resolution DACs is used for converting the least significant bits (referred to as LSB hereinafter) of the high-resolution digital signal. By such arrangement, a device mismatch is avoided and the chance of variation occurrence during manufacturing process is reduced. The arrangement also simplifies the layout in the significantly scaled-down chip area.

The difference between the current provided by the two lower-resolution DACs is determined according to the number of bits to be converted. For example, if it is a 10-bit digital signal, the two current steering DACs are 5-bit DACs respectively, and the current provided are 32 times different. The output current of the MSB digital-to-analog conversion is magnified 32 times with, for example, a current mirror, and the total output current IOUT is ($I_{MSB}*32+I_{LSB}$).

Compared with a conventional current steering DAC, if estimated by unit current source cell, the chip array area required by the current steering DAC provided by the present invention can be reduced 80%, and the power consumed can be effectively reduced up to 50%.

Figure 4:
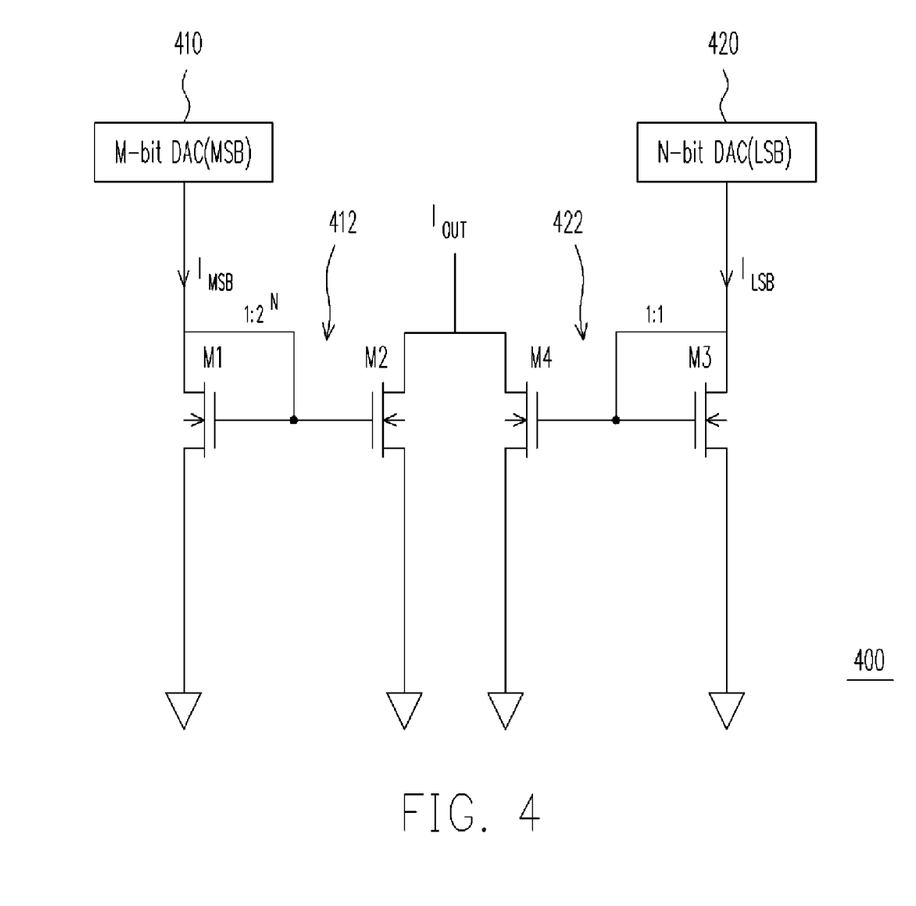
FIG. 4 is a diagram illustrating the circuit of a current steering DAC according to the present invention.

Please refer to the structure shown in FIG. 4, which is a diagram illustrating the circuit of a current steering DAC according to the present invention. The current steering DAC 400 in the present embodiment is mainly formed by an M-bit DAC 410 and an N-bit DAC 420. The M-bit DAC 410 is used for MSB digital-to-analog conversion. The output current $I_{MSB}$ of the MSB digital-to-analog conversion is mapped, converted, and magnified $2^N$ times by using a current mirror 412 having input/output ratio $1:2^N$. The current mirror 412 includes two transistors M1 and M2. The other N-bit DAC 420 is used for LSB digital-to-analog conversion, and the output current $I_{LSB}$ of the LSB digital-to-analog conversion is output directly by using a current mirror 422 having input/output ratio of 1:1. The current mirror 422 includes two transistors M3 and M4. The total output current $I_{OUT}$ is ($I_{MSB}*2^N+I_{LSB}$).

In the present embodiment, the current mirrors 412 and 422 are both formed by NMOS transistors; however, to those skilled in the art, the current mirrors 412 and 422 can also be formed by PMOS transistors without departing from the scope of the present invention.

In another embodiment, the ratio between the input current and the output current of the current mirrors 412 and 422 can be set differently so as to perform (M+N)-bit digital-to-analog conversion. According to the current steering DAC provided by the present invention, the conversion ratio of the current mirror can be a fraction, that is, less than 1. For example, if the ratio between the input current and the output current of the current mirror 412 is $1:2^{N+1}$, then the ratio between the input current and the output current of the current mirror 422 is 1:2; that is, the output current of the two current mirrors are increased or decreased by the same multiple. For example, if the magnification power of the current mirror 412 is increased by two, then the magnification power of the current mirror 422 is also increased by two. If the output current $I_{MSB}$ of the MSB digital-to-analog conversion is mapped, converted, and magnified $2^{N-1}$ times; that is, the ratio between the input current and the output current of the current mirror 412 is $1:2^{N-1}$, then the ratio between the input current and the output current of the current mirror 422 is $1:2^{-1}$; that is, 1:1/2. In other words, if the ratio between the input current and the output current of the current mirror 412 is $1:2^{N-X}$, then the ratio between the input current and the output current of the current mirror 422 is $1:2^{-X}$, wherein x is an positive integer.

In another embodiment, the DACs 410 and 420 can also be DACs of the same bit number. For example, a 2N-bit digital-to-analog conversion can be performed through changing the ratio between the input current and the output current of the current mirrors 412 and 422. For example, to perform a 10-bit digital-to-analog conversion, the ratio between the input current and the output current of the current mirror 412 can be set to $1:2^8$, and then the ratio between the input current and the output current of the current mirror 422 is 1:8. If the ratio between the input current and the output current of the current mirror 412 is set to be $1:2^9$, then the ratio between the input current and the output current of the current mirror 422 can be 1:16.

It can be understood from the embodiments described above that the current steering DAC provided by the present invention mainly uses two lower-resolution DACs for converting a high-resolution digital signal, wherein one of the two lower-resolution DACs is used for the digital-to-analog conversion of M MSB, and the other of the two lower-resolution DACs is used for the digital-to-analog conversion of N LSB. If the output current of the M MSB digital-to-analog conversion is magnified $2^N$ times using, for example, a current mirror, then the total output current is ($2^N$)×(output current of the MSB DAC)+1×(output current of the LSB DAC).

Figure 5:
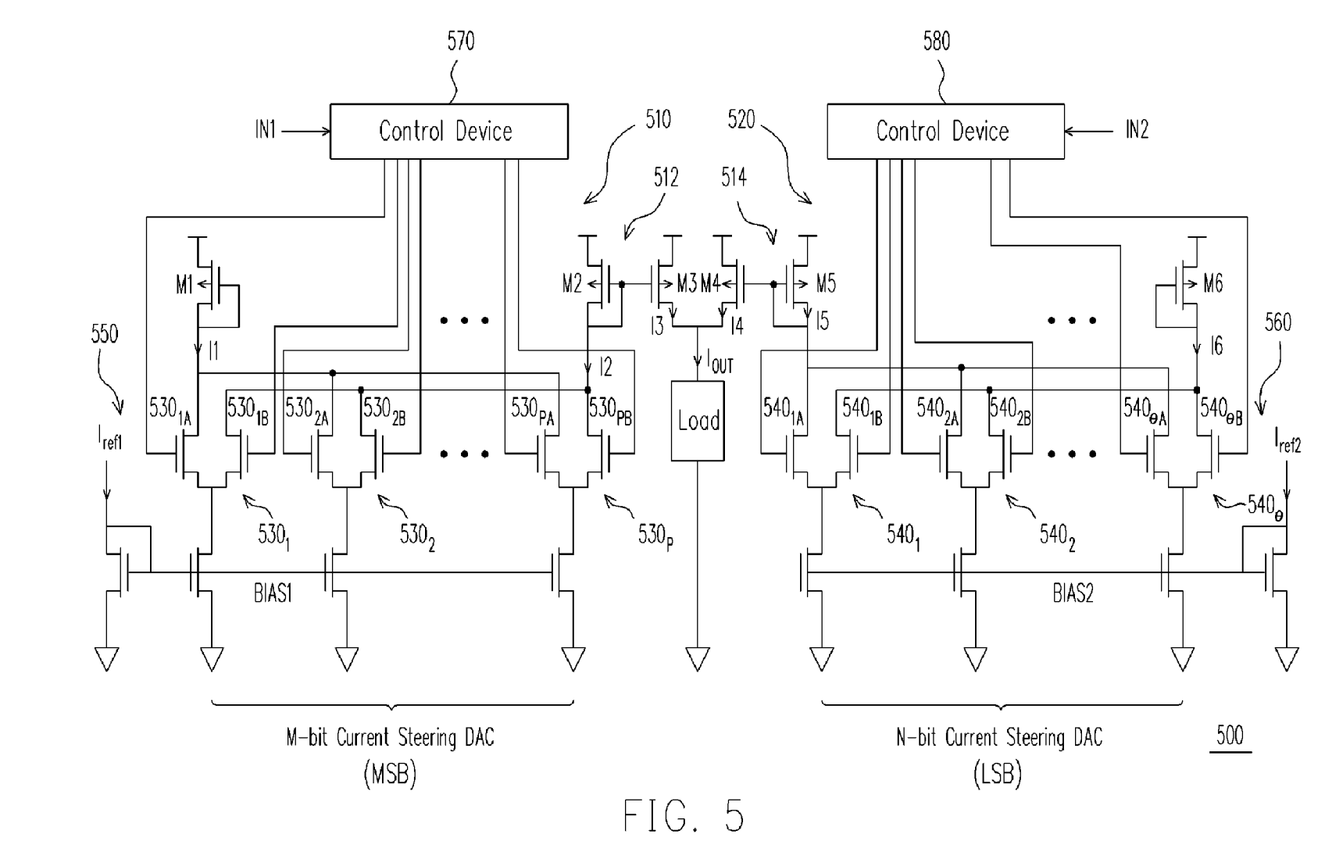
FIG. 5 is a detailed circuit diagram of a current steering DAC according to the present invention.

FIG. 5 is a detailed circuit diagram of a current steering DAC according to an embodiment of the present invention. The current steering DAC 500 in the present exemplary embodiment is mainly formed by an M-bit current steering DAC 510 and an N-bit current steering DAC 520. Bias BIAS1 and BIAS2 respectively generated by the bias generation units 550 and 560 according to the reference current $I_{REF1}$ and $I_{REF2}$ are respectively provided to the current steering DACs 510 and 520. In another embodiment, the same bias generation unit can also be used to generate the same bias. However, two different bias generation units are used here to handle the device matching of the M-bit current steering DAC 510 and the N-bit current steering DAC 520 respectively, though this is not to limit the present invention.

The current steering DAC 510 includes a plurality of control units $530_1, 530_2 \ldots 530_P$, which are respectively formed by, e.g. transistors $530_{1A}$, $530_{1B}$, $530_{2A}$, $530_{2B}$ ... $530_{PA}$, and $530_{PB}$. As shown in FIG. 5, the current of transistor M1 is $I_1$, the current of transistor M2 is $I_2$, the sum thereof is a constant value, and the current passing through the transistors M1 and M2 can be adjusted with a control device 570 controlling the on/off of the control units $530_1$, $530_2$ ... $530_P$ to be output as the output current of the current steering DAC 510. The control unit 570 can control the aforementioned transistors based on different input signal IN1.

The current steering DAC 520 includes a plurality of control units $540_1$, $540_2$ ... $540_Q$, which are respectively formed by, e.g. transistors $540_{1A}$, $540_{1B}$, $540_{2A}$, $540_{2B}$ ... $540_{PA}$, and $540_{PB}$. As shown in FIG. 5, the current of transistor M6 is $I_6$, the current of transistor M5 is $I_5$, the sum thereof is a constant value, and the current passing through the transistors M5 and M6 can be adjusted with a control device 580 controlling the on/off of the control units $540_1$, $540_2$ ... $540_P$ to be output as the output current of the current steering DAC 520. The control unit 580 can control the aforementioned transistors based on different input signal IN2.

In addition, the current steering DAC 500 in the present embodiment further includes current mirror 512 formed by transistors M2 and M3, and current mirror 514 formed by transistors M4 and M5. The current $I_3$ and $I_4$ are generated correspondingly according to the output current $I_2$ of the current steering DAC 510 and the output current $I_5$ of the current steering DAC 520, and the total current $I_{OUT}(I_3+I_4)$ is output to a load as the output of the current steering DAC 500.

The difference between the present invention and the conventional design will be described below with reference to the actual figures according to the aforementioned embodiment. Here, the resolution is, e.g. 10-bit and the unit current is, e.g. 1 µA, then the two current steering DACs are respectively 5-bit DACs.

The embodiment of the present invention requires $2\times(2^5-1)=62$ current source cells, and additionally requires 35 mapping units (as the ones shown in FIG. 5, which can integrate, map, and output the source current of the current mirror by various control units). If code=max, then the current consumed in the present embodiment is $((2\times(2^5-1)+(32+1)\times(2^5-1))\times1$ µA=1085 µA. If code=0, the current consumed in the present embodiment is $2\times(2^5-1)\times1$ µA=62 µA. That is, the total current consumed is (unit current×33× MSB code)+(unit current×2×LSB code).

According to the conventional design, a 10-bit current steering DAC with the same function requires $(2^{10}-1)=1023$ current source cells, and if code=max, the current consumed is 1023×1 µA=1023 µA, and if code=0, the current consumed is also 1023×1 µA=1023 µA.

Note that the present invention can reduce the size of the current cell array and the average current consumption effectively. Since the current cell array is reduced effectively, the layout of the current cell array is simpler compared with the conventional layout. Accordingly, the problem of device mismatch can be avoided.

According to the current steering DAC provided by the present invention, the conversion ratio of the current mirror can also be fraction, that is, less than 1.

In addition, according to the present invention, the combination of an M MSB DAC and an N LSB DAC is used. If the unit current in the current source cells of the M MSB DAC is increased, the conversion ratio of the current mirror can be reduced to prevent errors.

To prevent errors produced by the current mirrors, as described above, the bias provided to the M MSB DAC and the N LSB DAC can be set to different values (i.e. BIAS1 not equal to BIAS2 as shown in FIG. 5); that is, different bias are applied to the two DACs. In addition, the proportional shifting of the transistors M2~M5, as shown in FIG. 5, corresponding to the current mirrors, can be compensated.

Since the current steering DAC provided by the present invention can greatly reduce the size of the current cell array, accordingly, the width and length of the current source cells can be further extended synchronously so as to reduce the effect of the wire layout over the circuit.

In overview, the current steering DAC of the present invention can greatly reduce chip area and power consumption. In addition, the conversion ratio of the current mirrors can be adjusted through the current of the DAC itself. Furthermore, since the size of the current cell array has been reduced considerably, the layout in the significantly scaled-down chip area can also be simplified effectively.

In addition, even though the current steering DAC in an embodiment of the present invention is formed by two lower-resolution DACs, it can also be formed by more (two or more than two) lower-resolution DACs. For example, in an embodiment, the current steering DAC is formed by 3 lower-resolution DACs. This can be achieved by changing only the design of the current mirrors. Thus, the current steering DAC formed by a plurality of lower-resolution DACs is within the scope of the present invention.

Moreover, to compensate the situation of device mismatch in a DAC, different bias can be provided to different DAC combination. Another compensation method is to fine-tune the ratio between the current mirrors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current steering digital-to-analog converter (DAC), used for converting a digital signal having a first bit number, the current steering DAC comprising:
   a first DAC, used for converting a digital signal having a second bit number and outputting a first output current;
   a second DAC, used for converting a digital signal having a third bit number and outputting a second output current, wherein the sum of the second bit number and the third bit number is equal to the first bit number;
   a first current mirror, used for mapping and outputting the first output current of the first DAC as a first mapped output current, wherein the first mapped output current is a magnified output current by multiplying the first output current of the first DAC by $2^N$, wherein N is an integer, and N=first bit number−second bit number; and
   a second current mirror, used for mapping and outputting the second output current of the second DAC as a second mapped output current, wherein the output of the current steering DAC is the total current of the first mapped output current and the second mapped output current.

2. The current steering DAC as claimed in claim 1, wherein the first mapped output current mapped and output by the first current mirror is less than the first output current of the first DAC.

3. The current steering DAC as claimed in claim 1, wherein the ratio between the first output current output by the first DAC and the first mapped output current mapped and output by the first current mirror can be adjusted according to the first output current.

4. The current steering DAC as claimed in claim 1, wherein the second bit number is the most significant bits (MSB) of the first bit number, and the third bit number is the least significant bits (LSB) of the first bit number.

5. The current steering DAC as claimed in claim 1, further comprising a bias generation unit used for providing a constant bias to the first DAC and the second DAC, so that the digital-to-analog conversion can be performed accordingly.

6. The current steering DAC as claimed in claim 1, further comprising a first bias generation unit used for providing a first constant bias to the first DAC and a second bias generation unit used for providing a second constant bias to the second DAC, so that the digital-to-analog conversion can be performed accordingly.

7. The current steering DAC as claimed in claim 1, wherein the first DAC includes a plurality of control units, selectively turned on according to a received digital signal having the second bit number, and a first input current is converted into the first output current of the first DAC accordingly.

8. The current steering DAC as claimed in claim 7, wherein the received digital signal having the second bit number is received by a control device and used for controlling the control units accordingly.

9. The current steering DAC as claimed in claim 1, wherein the second DAC includes a plurality of control units, selectively turned on according to a received digital signal having the third bit number, and a second input current is converted into the second output current of the second DAC accordingly.

10. The current steering DAC as claimed in claim 9, wherein the received digital signal having the third bit number is received by a control device and used for controlling the control units accordingly.

11. A current steering DAC, used for converting a (M+N)-bit digital signal, wherein M and N are integers, the current steering DAC comprising:
a first DAC, used for converting an M-bit digital signal and outputting a first output current;
a second DAC, used for converting a N-bit digital signal and outputting a second output current; and
a current mirror, used for mapping and outputting the first output current of the first DAC as a mapped output current, wherein the mapped output current is a magnified output current by multiplying the first output current of the first DAC by $2^N$, and the output of the current steering DAC is the total current of the mapped output current of the current mirror and the second output current of the second DAC.

12. The current steering DAC as claimed in claim 11, wherein the M-bit digital signal received and converted by the first DAC is the MSB of the (M+N)-bit digital signal, and the N-bit digital signal received and converted by the second DAC is the LSB of the (M+N)-bit digital signal.

13. The current steering DAC as claimed in claim 11, wherein the first DAC includes a plurality of control units, selectively turned on according to the received M-bit digital signal, and a first input current is converted into the first output current of the first DAC accordingly.

14. The current steering DAC as claimed in claim 13, wherein the M-bit digital signal received by the first DAC is received by a control device and is used for controlling the control units accordingly.

15. The current steering DAC as claimed in claim 11, the second DAC includes a plurality of control units, selectively turned on according to the received N-bit digital signal, and a second input current is converted into the second output current of the second DAC accordingly.

16. The current steering DAC as claimed in claim 15, wherein the N-bit digital signal received by the second DAC is received by a control device and is used for controlling the control units accordingly.

17. A current steering DAC, used for converting a (M+N)-bit digital signal, wherein M and N are integers, the current steering DAC comprising:
a first DAC, used for converting the M-bit digital signal and outputting a first output current;
a second DAC, used for converting the N-bit digital signal and outputting a second output current; and
a first current mirror, used for mapping and outputting the first output current of the first DAC as a first mapped output current, wherein the first mapped output current is the product of the first output current and $2^{(N-X)}$, wherein X is an integer greater than or equal to 0, and the second mapped output current is the product of the second output current and $2^{-X}$;
a second current mirror, used for mapping and outputting the second output current of the second DAC as a second mapped output current, wherein the output of the current steering DAC is the total current of the first mapped output current and the second mapped output current.

* * * * *